United States Patent [19]

Hamano et al.

[11] Patent Number: 4,987,560
[45] Date of Patent: Jan. 22, 1991

[54] SEMICONDUCTOR MEMORY DEVICE

[75] Inventors: Takahiro Hamano, Yamato; Masataka Matsui, Tokyo; Mitsuo Isobe, Tama, all of Japan

[73] Assignee: Kabushiki Kaisha Toshiba, Kawasaki, Japan

[21] Appl. No.: 328,662

[22] Filed: Mar. 27, 1989

[30] Foreign Application Priority Data

Mar. 30, 1988 [JP] Japan .................... 63-76951

[51] Int. Cl.$^5$ .................... G11C 7/00; G11C 29/00
[52] U.S. Cl. ................... 365/200; 365/230.06; 365/225.7
[58] Field of Search ............ 365/200, 230.06, 225.7; 307/202.1, 451

[56] References Cited

U.S. PATENT DOCUMENTS 4,587,638 5/1986 Isobe et al. .................... 365/200
4,829,481 5/1989 Johnson et al. ................. 365/200

FOREIGN PATENT DOCUMENTS 021304 3/1987 European Pat. Off. .......... 365/200
20397 2/1985 Japan ........................ 365/230.06

OTHER PUBLICATIONS

Sakurai et al., "A Low Power 46 ns 256 kbit CMOS Static RAM with Dynamic Double Word Line," IEEE Journal of Solid-State Circuits, vol. SC-19, No. 5, pp. 578-585, Oct. 1984.

Primary Examiner—Joseph A. Popek
Attorney, Agent, or Firm—Finnegan, Henderson, Farabow, Garrett, and Dunner

[57] ABSTRACT

A main row decoder for driving main word lines in a main memory cell array includes partial decoders the number of which is equal to the number of the main word lines. Each partial decoder includes a NAND gate for receiving row address signals, an inverter for driving a corresponding main word line in response to an output from the NAND gate, a fuse element connected between the output terminal of the NAND gate and the input terminal of the inverter, and a MOS transistor connected between the input terminal of the inverter and a power supply voltage.

4 Claims, 5 Drawing Sheets

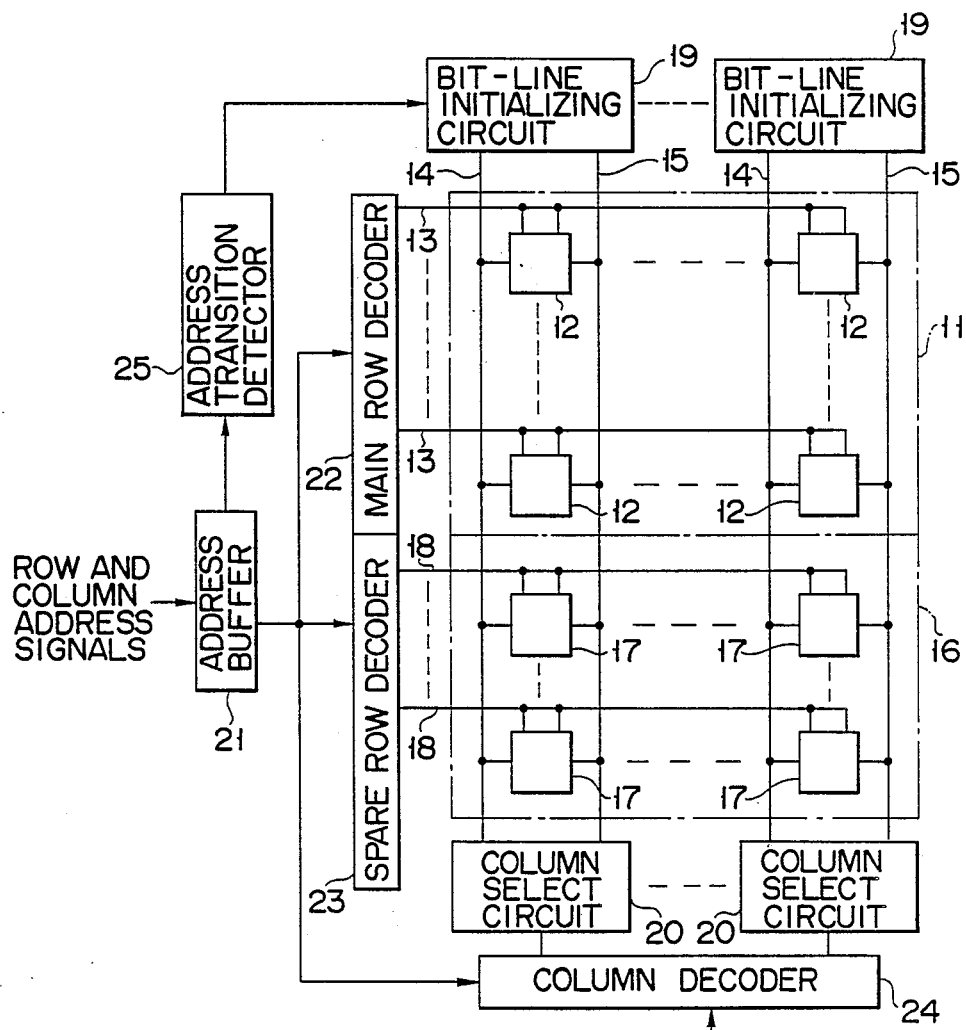
F I G. 2

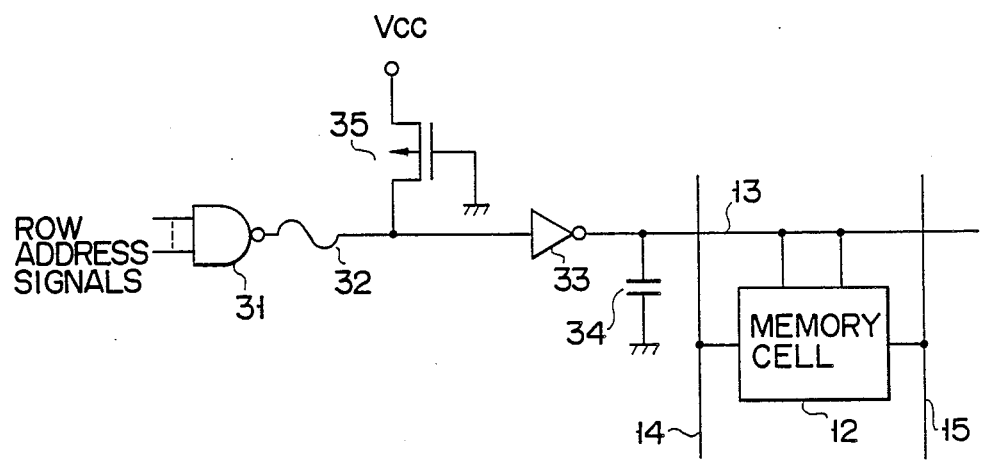
F I G. 3
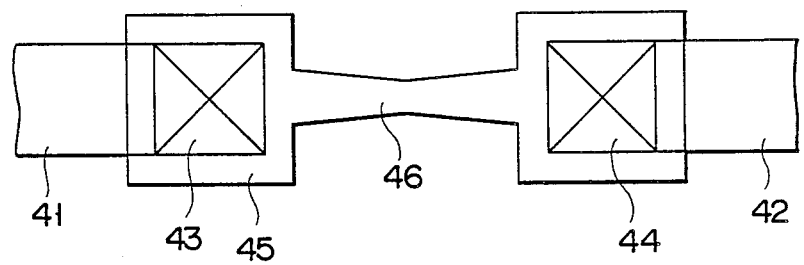
F I G. 4

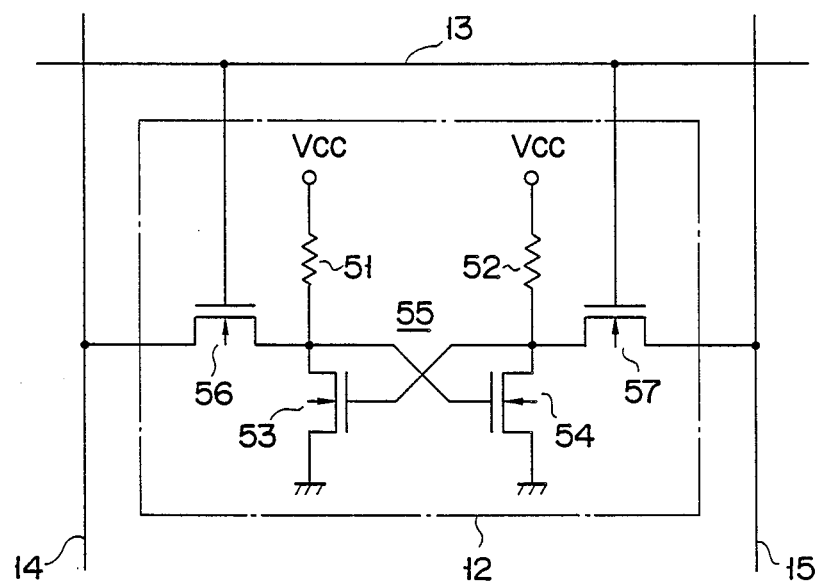
F I G. 5
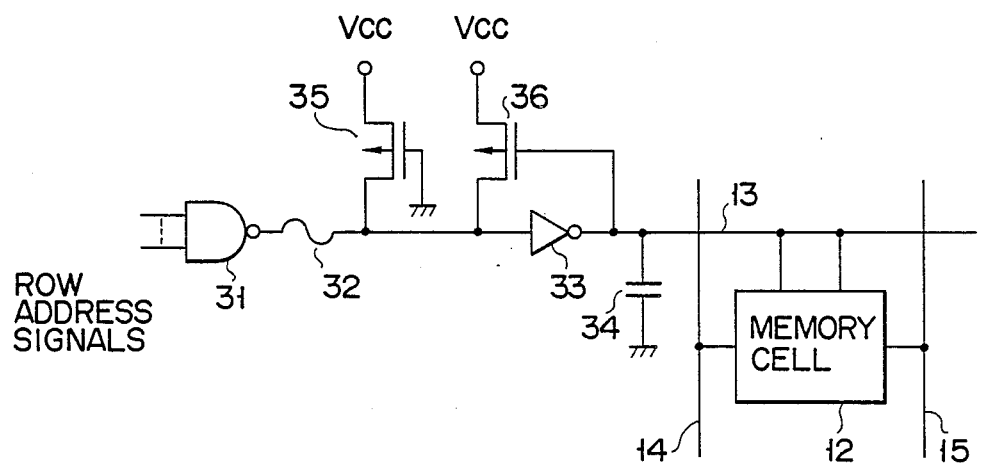
F I G. 6

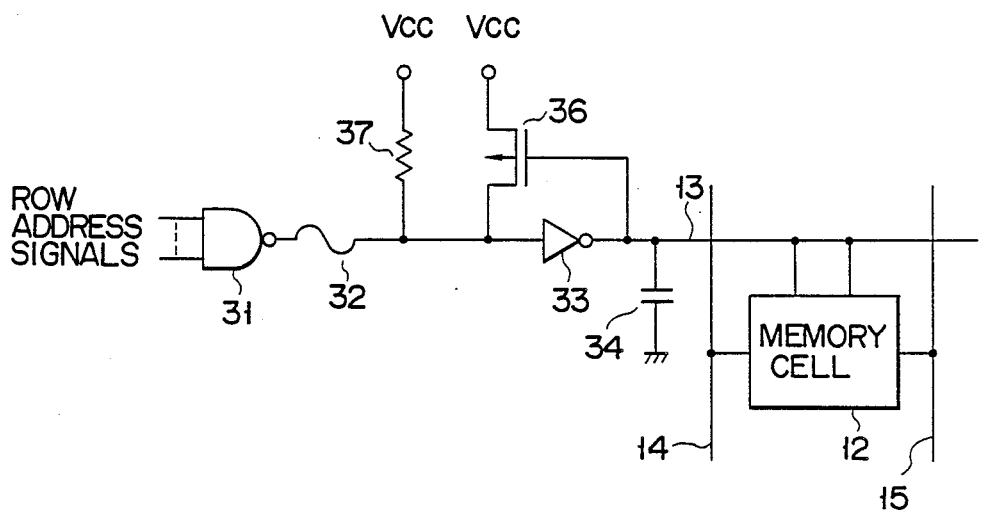
F I G. 7
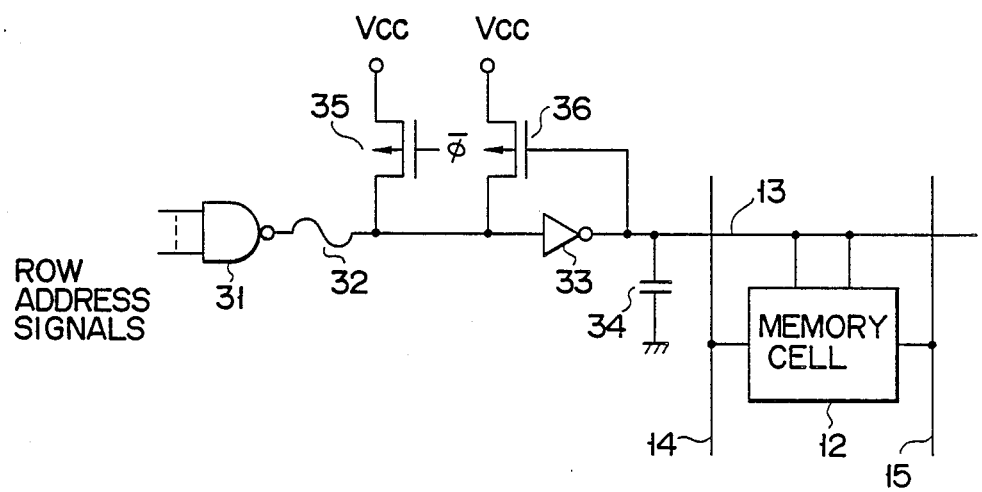
F I G. 8

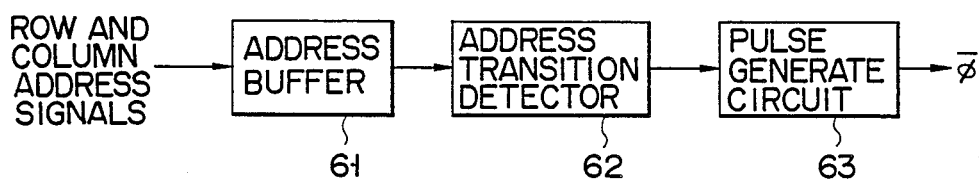
F I G. 9
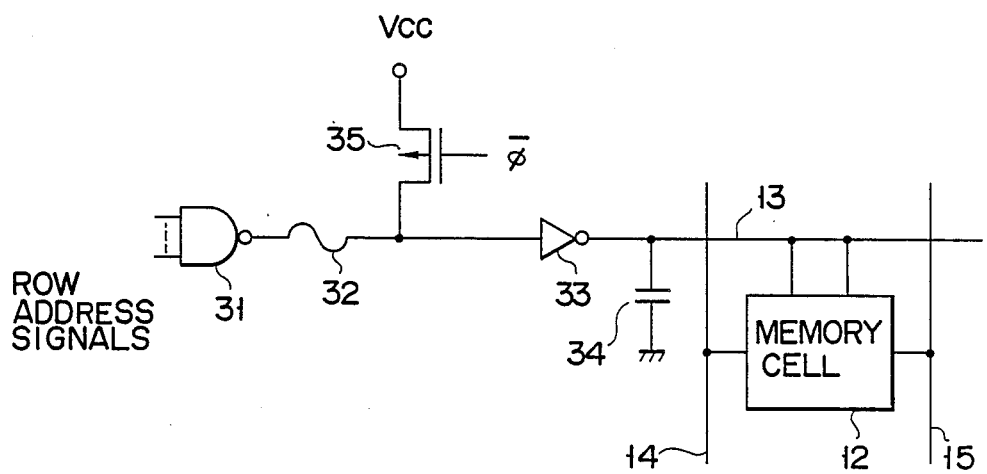
F I G. 10

SEMICONDUCTOR MEMORY DEVICE

BACKGROUND OF THE INVENTION

1. Field of the Invention

The present invention relates to a random access semiconductor memory device including a spare memory cell array besides a main memory cell array.

2. Description of Related Art

In a random access memory (RAM), data can be written and read out at all times. In RAM, as a memory capacity is increased, a redundancy function is often added for the purpose of saving a defective memory cell or defective word line. This redundancy function will be described below. That is, a memory cell having the same arrangement as that of a memory cell in a main memory cell array is arranged in a spare memory cell array in units of word lines. When a memory cell or word line in the main memory cell array is determined to be defective, memory cells of one row including the defective memory cell or memory cells of one row connected to the defective word line are replaced with spare memory cells of one row in the spare memory cell array, so that a product yield can be improved.

As described above, in order to switch from the main memory cell array to the spare memory cell array, a programmable circuit element such as a fuse element is arranged in a main row decoder for driving a word line in the main memory cell array.

FIG. 1 is a circuit diagram showing a part of a circuit associated with one word line of the main row decoder in a conventional semiconductor memory device. Referring to FIG. 1, reference numeral 71 denotes a NAND gate for receiving row address signals output from an address buffer (not shown). An output from the NAND gate 71 is input to an inverter 72 serving as a word line drive circuit. An output from the inverter 72 is output to a corresponding word line 74 through a fuse element 73 of, e.g., polysilicon. A plurality of memory cells 75 are connected to the word line 74 in parallel with each other (note that only one memory cell is shown in FIG. 1). The capacitance of the word line 74 itself and a parasitic capacitance 76 of the plurality of memory cells connected to the word line 74 are equivalently connected between the word line 74 and the ground potential. Note that reference numerals 77 and 78 denote bit lines for receiving complementary data read out from or to be written in each memory cell 75.

In the circuit having the above arrangement, if the word line 74 to which an output from the inverter 72 is applied, or each memory cell 75 connected to the word line 74 is not defective, the above-mentioned fuse element 73 is left in a state immediately after it is manufactured and is not disconnected. In this state, row address signals output from the address buffer are supplied to the NAND gate 71. When an output from the NAND gate 71 is set at "L", an output from the inverter 72 is set at "H", and a corresponding word line 74 is selected and driven.

On the other hand, if the word line 74 is defective, or at least one defective memory cell is present in the plurality of memory cells 75 connected to the word line 74, an energy beam such as a laser light beam is radiated on the fuse element 73, and the fuse element 73 is disconnected. Assume that when the fuse element 73 is disconnected, row address signals are supplied to the NAND gate 71, and an output from the NAND gate 71 is set at "L". However, since the fuse element 73 is disconnected, an output from the NAND gate 71 is not supplied to the inverter 72. Therefore, the word line 74 is not selected nor driven. On the other hand, the row address signals are supplied to the NAND gate 71, so that a spare word line to which memory cells of one row in the spare memory cell array (not shown) are connected is selected and driven by a spare row decoder (not shown). Thus, a defective memory cell in the main memory cell array is replaced by a memory cell in the spare memory cell.

The above-mentioned fuse element 73 of polysilicon has a certain resistance component. As described above, the parasitic capacitance 76 is present on the word line 74. The capacitance 76 tends to be increased as the capacity of the memory device is increased. For this reason, in the conventional semiconductor memory device, an integrated circuit comprises a resistance component of the fuse element 73 and the parasitic capacitance 76, and a time constant of the integrated circuit is increased. Therefore, an output signal of the inverter 72 is considerably delayed. As a result, in the conventional device, high-speed operation cannot be easily realized.

In addition, conventionally, when the fuse element 73 is disconnected, the word line 74 is set in a potential floating state. Therefore, a change in ground potential tends to affect the word line 74, and a stable operation cannot be expected.

SUMMARY OF THE INVENTION

It is, therefore, an object of the present invention to provide a semiconductor memory device which can realize a high-speed and stable operation.

According to the present invention, there is provided a semiconductor memory device comprising main and spare memory cell arrays in each of which a plurality of memory cells are arranged, and having a redundancy function for replacing a defective memory cell in the main memory cell array with a memory cell of the spare memory cell array in units of word lines, comprising a plurality of main word lines to which a plurality of memory cells arranged in each row of the main memory cell array are connected in parallel, and a main row decoder for receiving row address signals and selectively driving the plurality of main word lines in response to the row address signals, wherein the main row decoder comprises partial decoders the number of which is equal to the number of the main word lines, wherein each of the partial decoders includes a decoder for receiving row address signals, a drive circuit for driving a corresponding one of the main word lines in response to an output from the decoder, a fuse element inserted between an output terminal of the decoder and an input terminal of the drive circuit, and an impedance element inserted between the input terminal of the drive circuit and a predetermined potential.

According to the present invention, there is provided a semiconductor memory device comprising main and spare memory cell arrays in each of which a plurality of memory cells are arranged, and having a redundancy function for replacing a defective memory cell in the main memory cell array with a memory cell of the spare memory cell array in units of word lines, comprising a plurality of main word lines to which a plurality of memory cells arranged in each row of the main memory cell array are connected in parallel, and a main row decoder for receiving row address signals and selectively driving the plurality of main word lines in response to the row address signals, wherein the main row decoder comprises partial decoders the number of which is equal to the number of the main word lines wherein each of the partial decoders includes a decoder for receiving row address signals, a drive circuit for driving a corresponding one of the main word lines in response to an output from the decoder, a fuse element inserted between an output terminal of the decoder and an input terminal of the drive circuit, an impedance element inserted between the input terminal of the drive circuit and a predetermined potential, and a first MOS transistor inserted between the input terminal of the drive circuit and the predetermined potential, and ON-/OFF controlled in response to an output from the drive circuit.

BRIEF DESCRIPTION OF THE DRAWINGS

FIG. 2 is a block diagram showing an entire arrangement of a semiconductor memory device according to the present invention;

FIG. 3 is a circuit diagram showing an arrangement of the semiconductor memory device according to a first embodiment of the present invention;

FIG. 4 is a plan view showing a detailed arrangement of a fuse element used in the circuit according to the embodiment in FIG. 3;

FIG. 5 is a circuit diagram showing a detailed arrangement of a memory cell used in the circuit according to the embodiment in FIG. 3;

FIG. 6 is a circuit diagram showing an arrangement of the semiconductor memory device according to a second embodiment of the present invention;

FIG. 7 is a circuit diagram showing an arrangement of the semiconductor memory device according to a third embodiment of the present invention;

FIG. 8 is a circuit diagram showing an arrangement of the semiconductor memory device according to a fourth embodiment of the present invention;

FIG. 9 is a circuit diagram showing a detailed arrangement for generating a pulse signal used in the circuit, according to the fourth embodiment; and FIG. 10 is a circuit diagram showing an arrangement of the semiconductor memory device according to a fifth arrangement of the present invention.

DETAILED DESCRIPTION OF THE PREFERRED EMBODIMENTS

Figure 1:
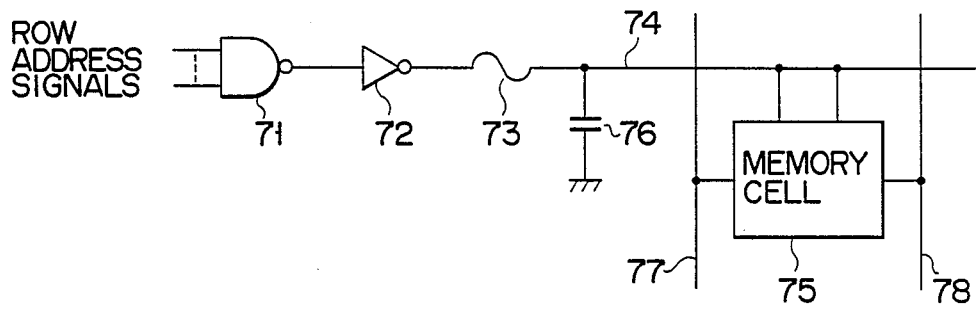
FIG. 1 is a circuit diagram showing a part of a circuit in a conventional semiconductor memory device.

First, an entire static semiconductor memory device to which the present invention is applied will be generally described hereinafter with reference to FIG. 2. Referring to FIG. 2, reference numeral 11 denotes a main memory cell array in which a plurality of static memory cells 12 are arranged in a matrix form. A plurality of memory cells 12 arranged in a single row in the main memory cell array 11 are commonly connected to one of a plurality of main word lines 13. A plurality of memory cells 12 arranged in a single column in the main memory cell array 11 are commonly connected to one of a plurality of pairs of bit lines 14 and 15. Reference numeral 16 denotes a spare memory cell array in which memory cells 17, having the same arrangement as that of the memory cells 12, and which replaces a defective memory cell 12 in the main memory cell array or defective main word line 13 are arranged in a matrix form. In the spare memory cell array 16, a plurality of memory cells 17 arranged in a single row are commonly connected to one of a plurality of spare word lines 18. A plurality of memory cells 17 arranged in a single column are commonly connected to one of the plurality of pairs of bit lines 14 and 15. In addition, bit line initializing circuits 19 and column select circuits 20 are connected to the plurality of pairs of bit lines 14 and 15, respectively.

Reference numeral 21 denotes an address buffer to which row and column address signals are externally input. An output from the address buffer 21 is parallelly supplied to a main row decoder 22, a spare row decoder 23, a column decoder 24, and an address transition detector 25. The main row decoder 22 selects and drives one of the main word lines 13 of the main memory cell array 11 in response to an output from the address buffer 21. The spare row decoder 23 selects and drives one of the spare word lines 18 of the spare memory cell array 16 in response to an output from the address buffer 21 when a redundancy function is used. In response to an output from the address buffer 21, the column decoder 24 drives one of the plurality of column select circuits 20 so as to select a corresponding pair of bit lines 14 and 15. The address transition detector 25 detects a transition in an input address in response to an output from the address buffer 21 and generates a pulse signal synchronized with the address transition. The pulse signal generated by the address transition detector 25 is supplied to each bit line initializing circuit 19. When each bit line initializing circuit 19 receives the pulse signal, a corresponding pair of bit lines 14 and 15 is initialized to be set at a predetermined potential, e.g., high potential, before data is written in or read out from the memory cells 12 in the main memory cell array 11 or the memory cells 17 in the spare memory cell array 16.

In the memory device having the above arrangement, assume that no defective memory cell is present in the main memory cell array 11, the main word line 13 is not disconnected, and all device components are normal. In this case, when new address signals are input to the address buffer 21, the pairs of bit lines 14 and 15 are initialized to an equal potential by the bit line initializing circuits 19, respectively. Then, one main word line 13 in the main memory cell array 11 is selected and driven by the main row decoder 22 in response to input address signals at this time, and memory cells 12 of one row connected to the driven main word line 13 are selected. For example, in the read mode, data is read out from these selected memory cells 12 of one row, and the potential of each pair of bit lines 14 and 15 is changed in accordance with corresponding read data. One pair of bit lines 14 and 15 is selected by the column decoder 24 and column select circuit 20. The potential of the selected pair of bit lines is supplied to a sense amplifier (not shown), and data is detected. Thereafter, the detected data is output outside the memory device through an output circuit (not shown).

On the other hand, when a defective memory cell is present in the main memory cell array 11, or the main word line 13 is disconnected, the main row decoder 22 corresponding to the column having the defective word line or memory cell is replaced by the spare row decoder 23. Therefore, when new address signals corresponding to the main word line having the defective word line or memory cell are input to the address buffer 21, one spare word line 18 in the spare memory cell array 16 is selected and driven by the spare row decoder 23 in place of the main row decoder 22, and the memory cells 17 of one row connected to the driven spare word line 18 are selected. In the same manner as in the above case, one pair of bit lines 14 and 15 is selected by the column decoder 24 and column select circuit 20, and the potential of the selected pair of bit lines is supplied to the sense amplifier (not shown) and data is detected. Thereafter, the detected data is output outside the memory device through the output circuit (not shown). Therefore, even if a defective word line or memory cell is present in the main memory cell array 11, data is normally read out. When the data is written, only the direction of the data flow is reversed. Even if a defective word line or memory cell is present in the main memory cell array 11, normal data write operation can be performed.

FIG. 3 is a circuit diagram showing a detailed arrangement of a part of a decoder associated with one main word line 13 of the main row decoder 22 in the memory device shown in FIG. 2. Referring to FIG. 3, reference numeral 31 denotes a NAND gate for receiving row address signals output from the address buffer 21 and serving as a decoder. An output from the NAND gate 31 is input to an inverter 33 serving as a word line drive circuit through a fuse element 32 of polysilicon. An output from the inverter 33 is applied to a corresponding main word line 13. A capacitance of the word line itself and a parasitic capacitance 34 of the plurality of memory cells 12 connected to the main word line 13 are equivalently connected between the main word line 13 and the ground potential. In addition, a source-drain path of a p-channel MOS transistor 35 serving as an impedance element is connected between the input terminal of the inverter 33 and a positive power supply voltage Vcc. The gate of the transistor 35 is connected to the ground potential, and the transistor 35 is normally set in an "ON" state.

In the circuit having the above arrangement, if defects do not occur in the main word line 13 to which an output from the inverter 33 is applied, or in the plurality of memory cells 12 connected to the main word line 13, the above-mentioned fuse element 32 is left in the state immediately after it is manufactured and is not disconnected. In this state, when address signals are input to the address buffer 21, and an output from the NAND gate 31 is set at "L" in response to an output from the address buffer 21 at this time, an output from the inverter 33 is set at "H", and a corresponding main word line 13 is selected and driven. At this time, the inverter 33 is present between the fuse element 32 and the main word line 13. For this reason, an integrated circuit consisting of a resistance component of the fuse element 32 and a parasitic capacitance 34 does not exist In other words, an output from the NAND gate 31 serving as a decoder is supplied to the main word line 13 with almost no delay. As a result, high-speed operation can be achieved.

On the other hand, when the main word line 13 is defective, or a defective memory cell is present in the plurality of memory cells 12 connected to the main word line 13, an energy beam such as a laser beam is radiated on the fuse element 32 connected to the main word line 13, and the fuse element 32 is disconnected. When the fuse element 32 is disconnected, even if an output from the NAND gate 31 is set at "L", the output from the NAND gate 31 is not supplied to the inverter 33. Therefore, an output from the inverter 33 is not set at "H". In addition, the transistor 35 which is normally in an "ON" state is connected between the input terminal of the inverter 33 and the power supply voltage Vcc. For this reason, the output from the inverter 33 is always kept at "L", and the main word line 13 is not driven.

As described above, when the fuse element 32 is disconnected, the potential of the main word line 13 is not set in a floating state, and kept at non-selecting level "L". For this reason, the change in ground potential does not easily affect the main word line 13, and a stable operation can be expected.

Note that when the fuse element 32 is not disconnected and the output from the NAND gate 31 is set at "L", a current is supplied to the ground potential through the fuse element 32 and the NAND gate 31. For this reason, the element size of the transistor 35 must be selected so that the value of the current is sufficiently small.

The fuse element 32 used in the circuit shown in FIG. 3 is arranged, e.g., as shown in FIG. 4. Referring to FIG. 4, reference numerals 41 and 42 denote, e.g., aluminum wiring layers, respectively. A polysilicon layer 45 is connected to both the wiring layers 41 and 42 through contact holes 43 and 44. The polysilicon layer 45 includes a portion 46 having a decreased width. An energy beam is radiated on the portion 46 to disconnect the polysilicon layer 45.

The memory cell 12 used in the circuit shown in FIG. 3 is arranged, e.g., as shown in FIG. 5. The memory cell 12 is a so-called E/R-type memory cell suitable for high integration. More specifically, the memory cell 12 includes a flip-flop circuit 55 employing high resistors 51 and 52 as high loads, and employing enhancement-type MOS transistors 53 and 54 as driving transistors. Transfer gates 56 and 57 are connected between the flip-flop circuit 55 and one and the other of the pair of bit lines 14 and 15, respectively. Both the transfer gates 56 and 57 are connected to the above-mentioned main word line 13. Note that, although not shown, each memory cell 17 in the spare memory cell array 16 is arranged in the same manner as the memory cell 12.

Another embodiment of the present invention will be described below with reference to FIG. 6. In this embodiment, a p-channel MOS transistor 36 is added to the circuit shown in FIG. 3. A source-drain path of the transistor 36 is connected between the input terminal of an inverter 33 and a power supply voltage Vcc, and the gate of the transistor 36 is connected to the output terminal of the inverter 33.

In the circuit having the above arrangement, when a fuse element 32 is disconnected and the potential of the input terminal of the inverter 33 is set at "H" by the transistor 35, the transistor 36 is set in an "ON" state in response to an output from the inverter 33. For this reason, the level "L" of the main word line 13 is latched by the inverter 33 and transistor 36. Therefore, in the circuit in this embodiment, even if the potential of the power supply voltage Vcc is changed, the potential of the main word line 13 is always kept at level "L".

Still another embodiment of the present invention will be described below with reference to FIG. 7. In this embodiment, a resistor 37 is used in place of the transistor 35 in the circuit shown in FIG. 6. The resistance of the resistor 37 is selected to be relatively high, so that the value of a current flowing between a power supply voltage Vcc and the ground potential can be decreased, thereby reducing a current consumption.

Still another embodiment of the present invention will be described below with reference to FIG. 8. In this embodiment, the gate of the transistor 35 in the circuit shown in FIG. 6 is not connected to the ground potential, but a pulse signal φ to be set at "L" during an access period when row address signals are supplied to NAND gate 31.

In the circuit having the above arrangement, when a fuse element 32 is disconnected, the transistor 35 is turned on in response to the pulse signal φ at a start of reading or writing period of data, and an output from an inverter 33 is set at "L". Therefore, a transistor 36 is turned on, and the level "L" of a main word line 13 is latched by the inverter 33 and transistor 36. Therefore, even if the pulse signal φ returns to "H" and the transistor 35 is changed from the "ON" state to "OFF" state, the main word line 13 is kept at "L".

The pulse signal φ used in the circuit shown in FIG. 8 can be generated by, e.g., a circuit shown in FIG. 9. This circuit includes an address buffer 61 for receiving row and column address signals, an address transition detector 62 for receiving an output from the address buffer 61 and outputting a pulse signal when a transition in address is detected, and a pulse generate circuit 63 for outputting the pulse signal φ having a predetermined pulse width in response to an output pulse signal from the address transition detector 62. Note that the address buffer 21 may be used in place of the address buffer 61, and the address transition detector 25 may be used in place of the address transition detector 62.

Still another embodiment of the present invention will be described below with reference to FIG. 10. In this embodiment, the gate of the transistor 35 in the circuit shown in FIG. 3 is not connected to the ground potential, but the pulse signal φ obtained by the circuit shown in FIG. 9 is supplied to the gate of this transistor 35.

Note that the present invention is not limited to the above embodiments, and various changes and modifications may be made. For example, although the case wherein the main word line 13 is selected and driven at level "H" has been described in the above embodiments, a signal set at level "L" may be applied to the main word line 13 upon memory cell selection and driving in accordance with the arrangement of the memory cell. In this case, the potential of the input terminal of the inverter 33 must be set at "L" using the transistor 35 or resistor 37 in the circuit in each embodiment.

Although the spare row decoder 23 has not been described in detail in the above embodiments, the spare row decoder 23 may be programmed in advance so that the spare word line 18 in the spare memory cell array 16 is selected and driven when a row address signal corresponding to the defective row is input.

What is claimed is:

1. A semiconductor memory device comprising a main memory cell array and a spare memory cell array, wherein each of the memory cell arrays includes a plurality of rows, each of which comprises a plurality of memory cells, each of which is identified by a row address signal corresponding to the row of the memory cell arrays in which each memory cell resides and by a column address signal corresponding to the column of the memory cell arrays in which each memory cell resides, and wherein the semiconductor memory device has a redundancy function for substituting a row of memory cells in said main memory cell array with a row of memory cells of said spare memory cell array when a one of the memory cells in the row of memory cells of said main memory cell array is defective, comprising:

a plurality of main word lines to a respective one of which a plurality of memory cells arranged in a respective one of the rows of said main memory cell array are connected in parallel; and a main row decoder for receiving row address signals and for driving said plurality of main word lines, wherein during a data access period said main row decoder receives a row address signal and selectively drives a one of said plurality of main word lines in response to the received row address signal, and wherein said main row decoder comprises partial decoders, the number of which is equal to the number of said main word lines, and each of said partial decoders includes:

a decoder for, during the data access period, receiving a row address signal;

a drive circuit for driving a corresponding one of said plurality of main word lines in response to an output from said decoder;

a fuse element inserted between an output terminal of said decoder and an input terminal of said drive circuit; and a MOS transistor having a source, drain and gate, a source-drain path being connected between an input terminal of said drive circuit and the predetermined potential, and means for applying a pulse signal to the gate to render the MOS transistor conductive when one of the memory cells connected to the corresponding main word line is defective.

2. The semiconductor memory device according to claim 1, wherein said drive circuit comprises an inverter for inverting an output from said decoder.

3. A semiconductor memory device comprising a main memory cell array and a spare memory cell array, wherein each of the memory cell arrays includes a plurality of rows, each of which comprises a plurality of memory cells, and wherein each memory cell is identified by a row address signal corresponding to the row of the memory cell arrays in which each memory cell resides and by a column address signal corresponding to the column of the memory cell arrays in which each memory cell resides, and wherein the semiconductor memory device has a redundancy function for substituting a row of memory cells in said main memory cell array with a row of memory cells of said spare memory cell array when a one of the memory cells in the row of memory cells of said main memory cell array is defective, comprising:

a plurality of main word lines to a respective one of which a plurality of memory cells arranged in a respective one of the rows of said main memory cell array are connected in parallel; and a main row decoder for receiving row address signals and for driving said plurality of main word lines, wherein during a data access period the main row decoder receives a row address signal and selectively drives a one of said plurality of main word lines in responsive to the received row address signal, wherein said main row decoder comprises partial decoders, the number of which is equal to the number of said main word lines, and each of said partial decoders includes:

a decoder for, during the data access period, receiving a row address signal;

a drive circuit for driving a corresponding one of said plurality of main word lines in responsive to an output from said decoder;

a fuse element inserted between an output terminal of said decoder and an input terminal of said terminal of said drive circuit;

an MOS transistor having a source, drain and gate, a source-drain path being connected between the input terminal of said drive circuit and a predetermined potential; and means for applying a pulse signal to the gate of said MOS transistor during the data access period indicating non-selection of the row of memory cells.

4. The semiconductor memory device according to claim 3, wherein said drive circuit comprises an inverter for inverting an output from said decoder.

* * * * *